(12) United States Patent
Doris et al.

(10) Patent No.: US 9,276,013 B1
(45) Date of Patent: Mar. 1, 2016

(54) INTEGRATED FORMATION OF SI AND SIGE FINS

(71) Applicant: International Business Machines Corporation, Armonk, NY (US)

(72) Inventors: Bruce B. Doris, Slingerlands, NY (US); Hong He, Schenectady, NY (US); Juntao Li, Cohoes, NY (US); Junli Wang, Slingerlands, NY (US); Chih-Chao Yang, Glenmont, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/601,338

(22) Filed: Jan. 21, 2015

(51) Int. Cl.
| | | |
|---|---|---|
| *H01L 27/12* | (2006.01) | |
| *H01L 21/8238* | (2006.01) | |
| *H01L 21/84* | (2006.01) | |
| *H01L 21/02* | (2006.01) | |
| *H01L 21/225* | (2006.01) | |
| *H01L 21/324* | (2006.01) | |
| *H01L 21/311* | (2006.01) | |
| *H01L 21/306* | (2006.01) | |
| *H01L 29/16* | (2006.01) | |
| *H01L 29/161* | (2006.01) | |
| *H01L 29/66* | (2006.01) | |
| *H01L 27/092* | (2006.01) | |

(52) U.S. Cl.
CPC ...... *H01L 27/1211* (2013.01); *H01L 21/02532* (2013.01); *H01L 21/2251* (2013.01); *H01L 21/30604* (2013.01); *H01L 21/31111* (2013.01); *H01L 21/324* (2013.01); *H01L 21/823807* (2013.01); *H01L 21/845* (2013.01); *H01L 27/0922* (2013.01); *H01L 29/16* (2013.01); *H01L 29/161* (2013.01); *H01L 29/6653* (2013.01); *H01L 29/66818* (2013.01)

(58) Field of Classification Search
CPC ............... H01L 21/823807; H01L 29/78696; H01L 29/66818; H01L 21/8252; H01L 21/823437; H01L 21/823828; H01L 27/0886
See application file for complete search history.

(56) References Cited

U.S. PATENT DOCUMENTS

| | | | | |
|---|---|---|---|---|
| 4,914,049 A | * | 4/1990 | Huang | ........... H01L 21/28 148/DIG. 11 |
| 6,271,094 B1 | * | 8/2001 | Boyd | ........... H01L 21/28114 257/E21.205 |
| 6,432,794 B1 | * | 8/2002 | Lou | ........... H01L 21/2885 257/303 |

(Continued)

OTHER PUBLICATIONS

Maiti, CK, "applications of Silicon-Germanium Heterostructure Devices", 2001, Taylor & Francis Group, p. 49.*

(Continued)

*Primary Examiner* — Evan Pert
*Assistant Examiner* — Gustavo Ramallo
(74) *Attorney, Agent, or Firm* — Cantor Colburn LLP; Vazken Alexanian

(57) ABSTRACT

A method of fabricating silicon (Si) and silicon germanium (SiGe) fins is described. The method includes forming at least two Si fins on a buried oxide (BOX) layer disposed on a substrate, at least one Si fin being formed in a first region and at least one Si fin being formed in a second region, the at least one Si fin in the second region being thinner than the at least one Si fin in the first region. The method also includes depositing an oxide mask over the first region, epitaxially growing an SiGe layer on the at least one Si fin in the second region, and performing a thermal annealing process to drive Ge from the SiGe layer into the at least one Si fin in the second region to form at least one SiGe fin in the second region.

20 Claims, 11 Drawing Sheets

(56) References Cited

U.S. PATENT DOCUMENTS

| | | | |
|---|---|---|---|
| 7,060,539 B2* | 6/2006 | Chidambarrao | H01L 29/66795 438/142 |
| 7,101,763 B1 | 9/2006 | Anderson et al. | |
| 7,605,039 B2* | 10/2009 | Cho | H01L 29/66818 257/E21.014 |
| 7,619,239 B2 | 11/2009 | Irisawa et al. | |
| 7,993,999 B2 | 8/2011 | Basker et al. | |
| 8,183,627 B2 | 5/2012 | Currie | |
| 8,466,012 B1* | 6/2013 | Chang | H01L 21/823821 257/347 |
| 2005/0280097 A1* | 12/2005 | Anderson | H01L 21/823857 257/371 |
| 2011/0024804 A1 | 2/2011 | Chang et al. | |
| 2011/0108920 A1* | 5/2011 | Basker | H01L 21/845 257/351 |
| 2011/0210393 A1 | 9/2011 | Chen et al. | |
| 2012/0091528 A1 | 4/2012 | Chang et al. | |
| 2012/0244711 A1 | 9/2012 | Yin et al. | |
| 2012/0280289 A1 | 11/2012 | Flachowsky et al. | |

OTHER PUBLICATIONS

Ohmi, Tadahiro, "Wet Process Technology for Innovative LSI/FPD Manufacturing", 2006, Taylore & Francis Group, p. 56.*

Ok et al., "Strained SiGe and Si FinFETs for High Performance Logic with SiGe/Si stack on SOI", 2010 IEEE International Electron Devices Meeting (IEDM), Dec. 6-8, 2010, pp. 1-4.

Smith et al., "Dual Channel FinFETs as a Single High-k/Metal Gate Solution Beyond 22nm Node", 2009 IEEE International Electron Devices Meeting (IEDM), 2009, pp. 1-4.

* cited by examiner

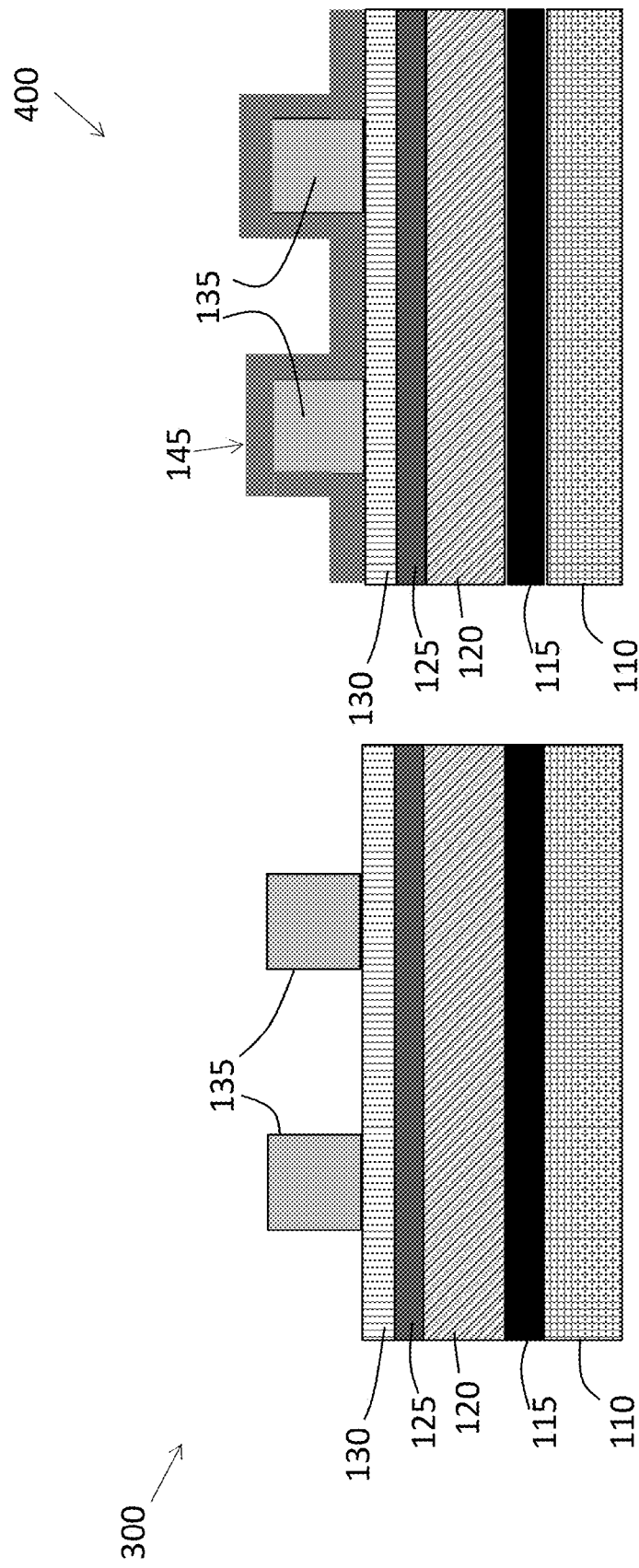

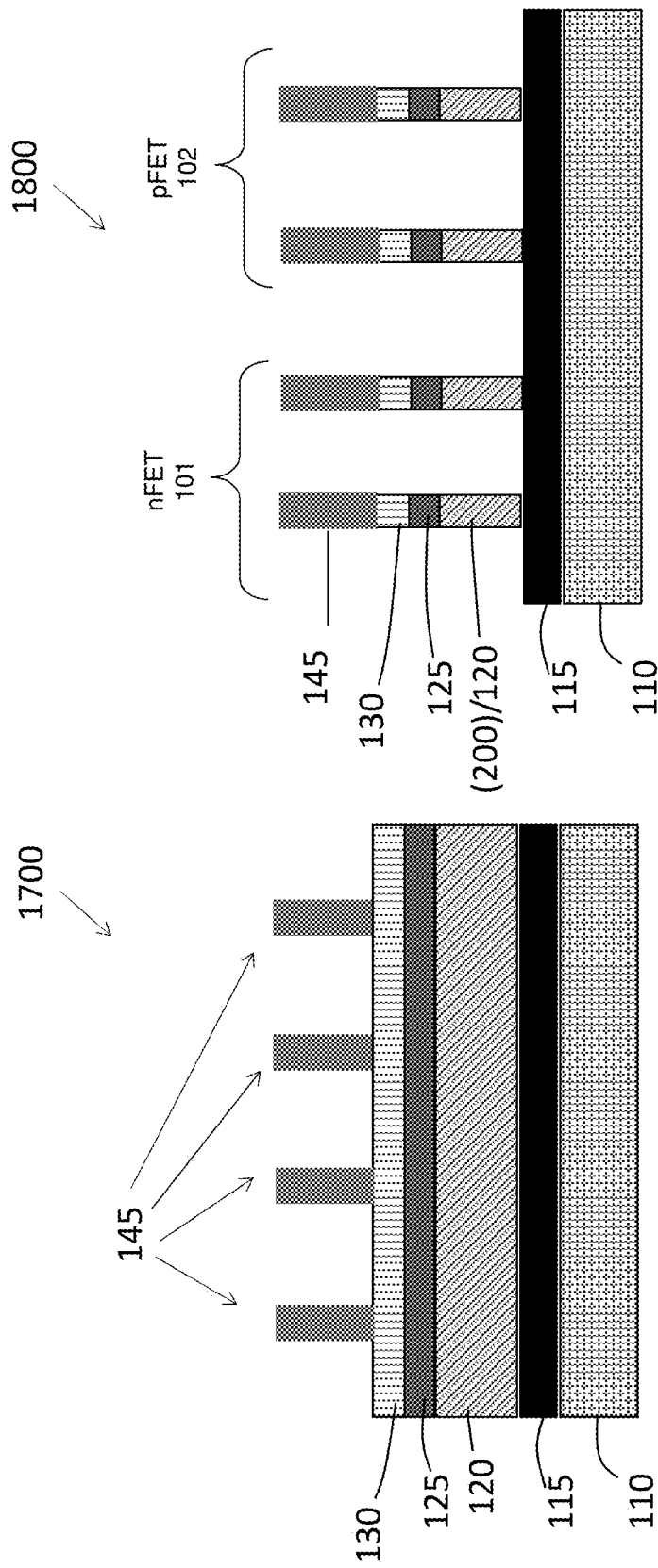

US 9,276,013 B1

INTEGRATED FORMATION OF SI AND SIGE FINS

BACKGROUND

The present invention relates to a fin field effect transistor (finFET), and more specifically, to the integrated formation of silicon (Si) and silicon germanium (SiGe) fins.

As integrated circuits continue to scale downward in size, the fin field effect transistor (finFET) is used increasingly with advanced technology nodes (e.g., the 22 nanometer (nm) node and beyond). In a finFET, the channel is formed by a semiconductor fin, and a gate electrode is located on at least two sides of the fin. Due to the advantageous feature of full depletion in a finFET (current between source and drain flows only through fins), the increased number of sides on which the gate electrode controls the channel of the finFET enhances the controllability of the channel in a finFET compared to a planar MOSFET. The improved control of the channel allows smaller device dimensions with less short channel effects as well as larger electrical current that can be switched at high speeds. In finFET devices, the conducting channel is wrapped by a Si or SiGe fin. The thickness of the fin (in the direction from source to drain) determines the channel length of the device. A complementary metal-oxide semiconductor (CMOS) device includes an Si fin in the n-channel FET (nFET) region and a SiGe fin in the p-channel FET (pFET) region. Thus, the Si and SiGe fins must be integrated on the same wafer. Currently, a silicon well is formed to define the pFET region, and advanced patterning techniques are used to pattern the SiGe fin.

SUMMARY

According to one embodiment of the present invention, a method of fabricating silicon (Si) and silicon germanium (SiGe) fins includes forming at least two Si fins on a buried oxide (BOX) layer disposed on a substrate, at least one of the at least two Si fins being formed in a first region and at least one of the at least two Si fins being formed in a second region, the at least one of the at least two Si fins in the second region being thinner than the at least one of the at least two Si fins in the first region; depositing an oxide mask over the first region; epitaxially growing an SiGe layer on the at least one of the at least two Si fins in the second region; and performing a thermal annealing process to drive Ge from the SiGe layer into the at least one of the at least two Si fins in the second region to form at least one SiGe fin in the second region.

According to another embodiment, a method of fabricating a complementary metal-oxide semiconductor (CMOS) device includes forming an re-channel field effect transistor (nFET) region; forming a p-channel field effect transistor (pFET) region; forming at least one silicon (Si) fin in the nFET region on a buried oxide (BOX) layer on a substrate; forming at least one Si fin in the pFET region on the BOX layer, the at least one Si fin in the PFET region being thinner than the at least one Si fin in the nFET region; depositing an oxide mask over the nFET region; epitaxially growing a silicon germanium (SiGe) layer on the at least one Si fin in the pFET region; and performing a thermal annealing process to drive Ge form the SiGe layer into the at least one Si fin in the pFET region to form at least one SiGe fin in the pFET region.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

FIGS. 1-16 are a series of cross-sectional views illustrating a method of forming an integrated fin structure for semiconductor devices in accordance with an exemplary embodiment, in which:

FIG. 1 is an intermediate structure in the fin formation according to an embodiment of the invention;

FIG. 2 illustrates a patterned lithographic mask on the structure of FIG. 1;

FIG. 3 illustrates the structure resulting from the transfer of the pattern shown in FIG. 2 to the mandrel layer;

FIG. 4 illustrates a structure resulting from deposition of a spacer material layer over the patterned mandrel layer of FIG. 3;

FIG. 5 illustrates the intermediate structure following an anisotropic etch process on the structure shown in FIG. 4;

FIG. 6 illustrates the intermediate structure resulting from a process to selectively etch the spacer material and hard mask layers of the structure shown in FIG. 5;

FIG. 7 is an intermediate structure resulting from deposition of a block mask on the structure shown in FIG. 6;

FIG. 8 illustrates an intermediate structure resulting from trimming sidewall spacers of the structure shown in FIG. 7;

FIG. 9 illustrates an intermediate structure resulting from removal of the block mask in the structure shown in FIG. 8;

FIG. 10 illustrates a structure formed from the structure shown in FIG. 9 with fins formed through an RIE process;

FIG. 11 shows the structure of FIG. 10 with the sidewall spacers, hard mask layer, and dielectric layer removed;

FIG. 12 shows the structure resulting from deposition and patterning of an oxide mask over the structure shown in FIG. 11;

FIG. 13 illustrates a structure resulting from epitaxially growing SiGe on a subset of the fins of the structure shown in FIG. 12;

FIG. 14 shows the structure that results from deposition of additional oxide on the structure shown in FIG. 13;

FIG. 15 illustrates a structure that includes SiGe fins based on a thermal anneal on the structure shown in FIG. 14;

FIG. 16 is a cross-sectional view of a structure that includes the Si fins and SiGe fins according to the exemplary embodiment of the invention;

FIGS. 17-22 are a series of cross-sectional views illustrating a method of forming an integrated fin structure for semiconductor devices in accordance with another exemplary embodiment, in which:

FIG. 17 is a cross-sectional view of a structure like the structure shown in FIG. 6;

FIG. 18 illustrates a structure resulting from performing an RIE process on the structure shown in FIG. 17;

FIG. 19 illustrates a structure resulting from removing the spacer material, hard mask layer, and dielectric layer from the structure shown in FIG. 18;

FIG. 20 shows the result of depositing an oxide mask over the structure of FIG. 19;

FIG. 21 illustrates the structure resulting from trimming fins of the structure of FIG. 20; and FIG. 22 is a cross-sectional view of a structure that includes the Si fins and SiGe fins according to the other exemplary embodiment of the invention.

DETAILED DESCRIPTION

As noted above, a finFET device may be a CMOS device that includes a p-type metal-oxide-semiconductor (pMOS) finFET device (pFET) and an n-type metal-oxide-semiconductor (nMOS) finFET device (nFET). As such, the CMOS involves the integration of a Si fin in the nFET region and an SiGe fin in the pFET region. As also noted above, the SiGe fin may be formed by patterning SiGe in a silicon well defining the pFET region. The SiGe layer in the pFET region is usually formed through a selective SiGe epitaxial growth on Si. This SiGe epitaxial process may present defectivity issues, especially for high-Ge-concentration SiGe, and may also suffer loss of epitaxial growth selectivity. Embodiments of the systems and methods detailed herein relate to integrated formation of Si and SiGe fins of the same dimensions. Once the Si and SiGe fins are formed, as detailed below, additional processes are used to complete the formation of the full CMOS device. These additional processes are known and, thus, not detailed herein. They include formation of the source, drain, and gate terminals and their contacts in both the nFET and the pFET.

Figure 1:
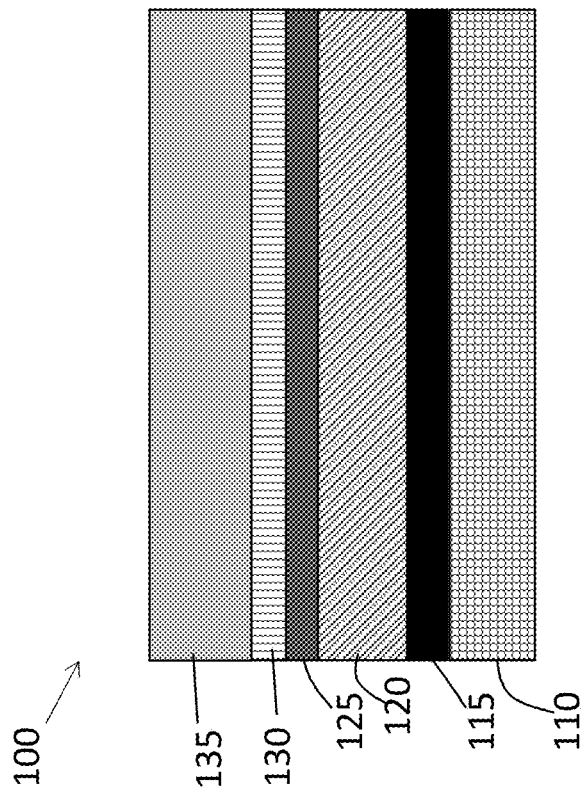
Figure 2:
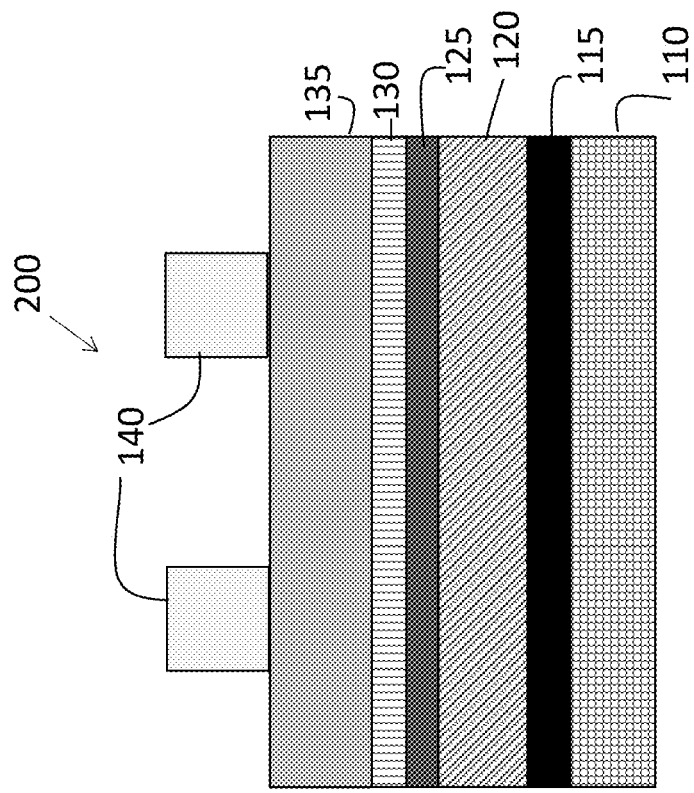

FIGS. 1-16 detail the processes involved in integrated fin formation according to one embodiment of the invention. FIG. 1 is a cross-sectional view of an intermediate structure 100 in the fin formation according to an embodiment of the invention. A buried oxide (BOX) layer 115 is formed on a substrate 110. The substrate 110 may comprise bulk silicon, germanium, gallium arsenide, or any other substrate material. The BOX layer 115 may be formed of silicon dioxide, for example, and has a semiconductor-on-insulator (SOI) (e.g., silicon) layer 120 formed above. A dielectric cap layer 125 is formed on the SOI layer 120 with a hard mask layer 130 formed above. A mandrel layer 135 deposited above the hard mask layer 130 may include silicon (e.g., polycrystalline silicon (polysilicon), amorphous silicon) and may be plasma-enhanced chemical vapor deposition (PECVD) polysilicon or amorphous silicon, for example. FIG. 2 illustrates the resulting structure 200 in the fin formation following the formation of a patterned lithographic mask 140 on the mandrel layer 135. The lithographic mask 140 may include three layers: a silicon containing antireflective coating (SiARC), an optical planarization layer, and a photoresist layer.

Figure 5:
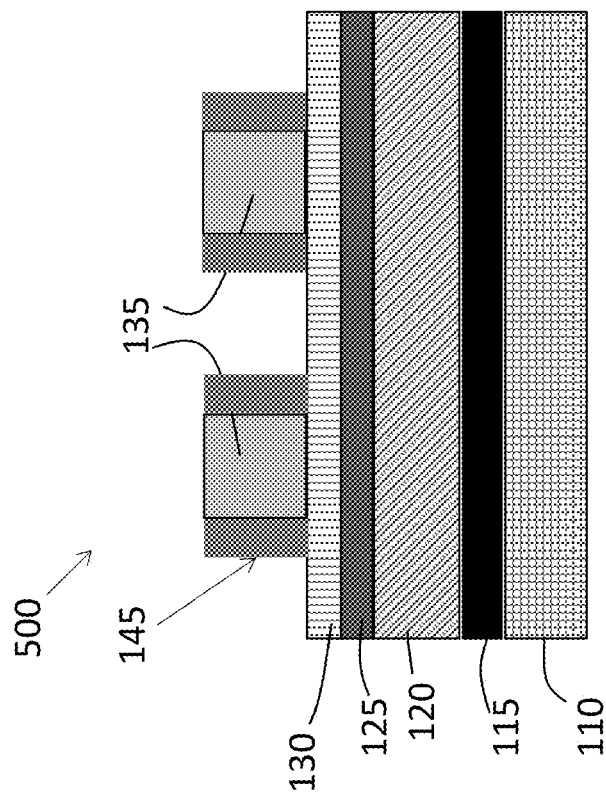

As shown in FIG. 3, the pattern of the lithographic mask 140 is transferred to the mandrel layer 135 such as by etching to result in the intermediate structure 300. Then, in FIG. 4, a spacer material layer 145 is deposited over the patterned mandrel layer 135 to result in the intermediate structure 400. The spacer material layer 145 may be an oxide or nitride (e.g., silicon nitride). FIG. 5 illustrates the resulting intermediate structure 500 following an anisotropic (directional) etch process to remove horizontal portions of the spacer material layer 145 to form sidewall spacers from the spacer material layer 145 adjacent the mandrels 135. Then, as shown in FIG. 6, the mandrel layer 135 material is pulled using another etch process selective to the spacer material layer 145 and the hard mask layer 130, to result in the intermediate structure 600.

Figure 6:
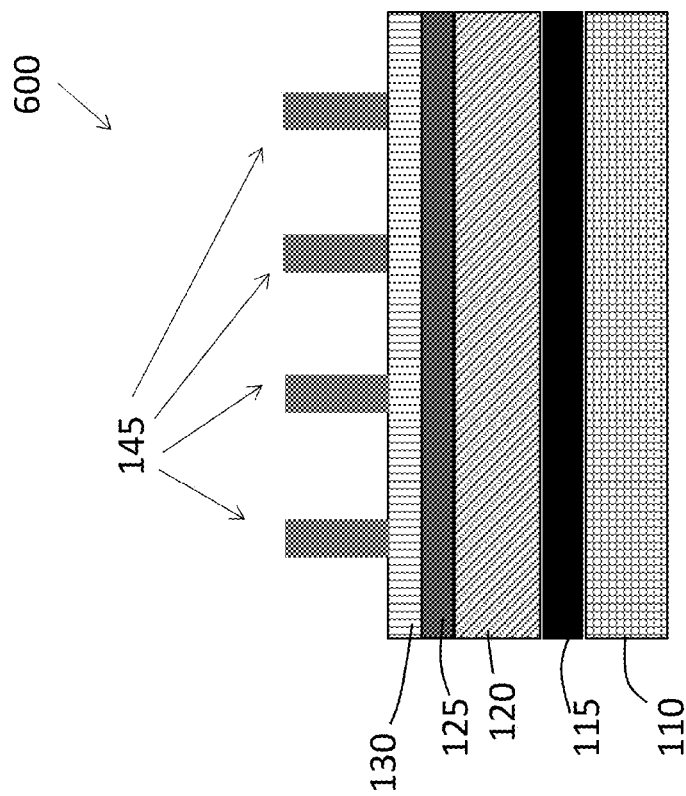
Figure 8:
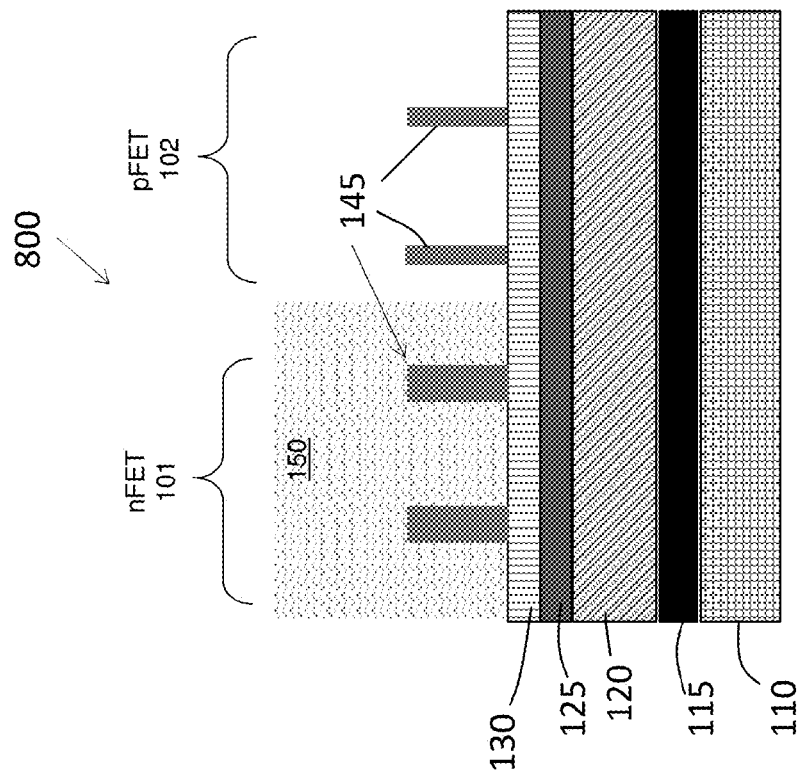
Figure 7:
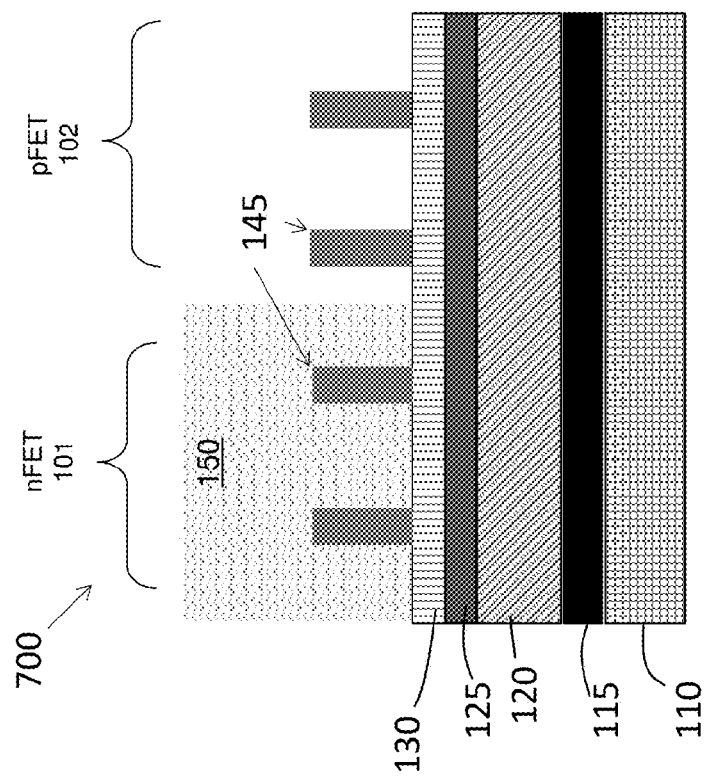

FIG. 7 illustrates an intermediate structure 700 in the fin formation after a block mask 150 is deposited on the structure 600 shown in FIG. 6 and patterned as shown in FIG. 7 to cover the nFET region 101. FIG. 8 illustrates another intermediate structure 800 in the fin formation wherein sidewall spacers of the spacer material 145 that are in the pFET region 102 are trimmed. If the spacer material 145 is an oxide, a chemical oxide removal (COR) process is used to trim the sidewall spacers in the pFET region 102. If the spacer material 145 is a nitride, the nitride is oxidized and dilute hydrogen fluoride (dHF) is then used to remove the oxide. As FIG. 8 indicates, the sidewall spacers formed from the spacer material 145 are narrower in the pFET region 102 than in the nFET region 101 due to the trimming.

Figure 10:
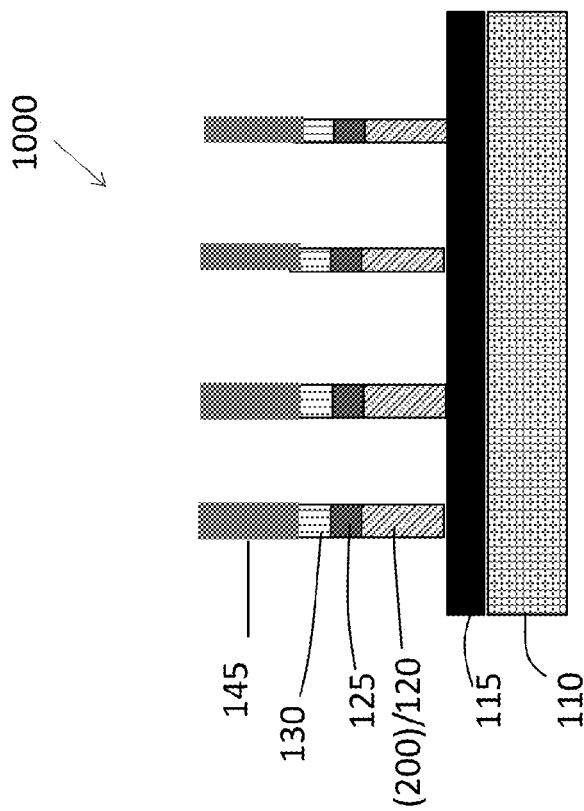
Figure 9:
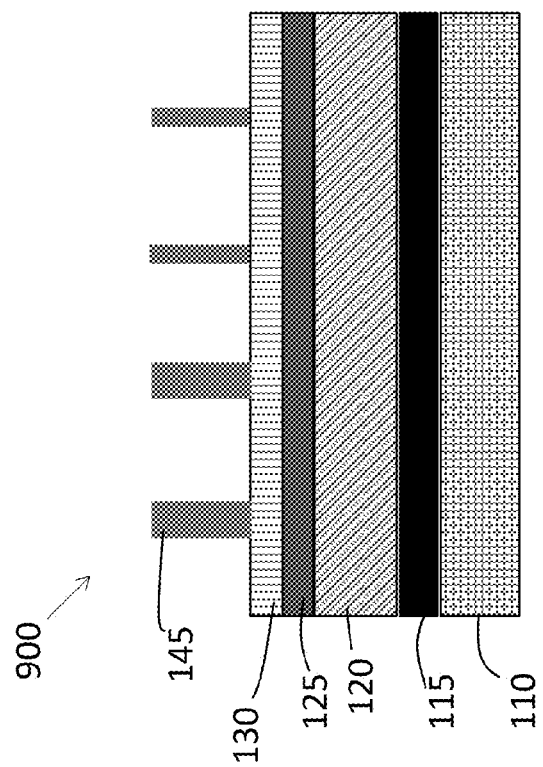
Figure 12:
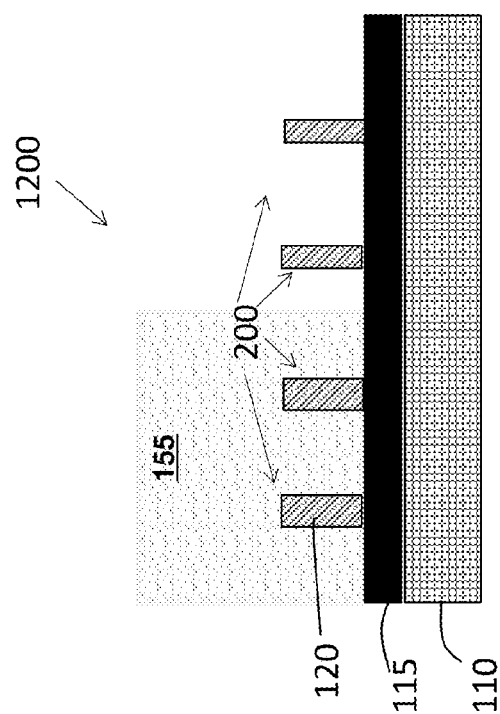
Figure 11:
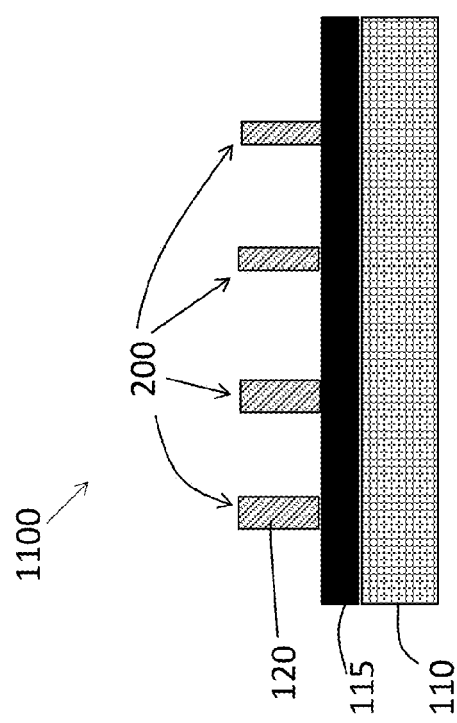

Referring to FIG. 9, the block mask 150 is removed, resulting in the intermediate structure 900. Then, as shown in FIG. 10, an RIE process is used to form Si fins 200 by transferring the pattern of the spacer material 145 through the hardmask layer 130 and dielectric cap layer 125 and into the SOI layer 120. Due to the thinning of the spacer material 145 in the pFET region 102, the resulting fin widths in the nFET region 101 are wider than those of the pFET region 102, as reflected by the intermediate structure 1000. In FIG. 11, remaining portions of the sidewall spacers formed from the spacer material 145, the hard mask layer 130, and the dielectric layer 125 are removed from the structure 1000 of FIG. 10, leaving the Si fins 200 in intermediate structure 1100. In FIG. 12, an oxide mask 155 is deposited over the structure 1100 shown in FIG. 11 and patterned to form a soft mask cover on the Si fins 200 and the nFET region 101, generally, resulting in the intermediate structure 1200. The pFET region 102 remains exposed.

Figure 14:
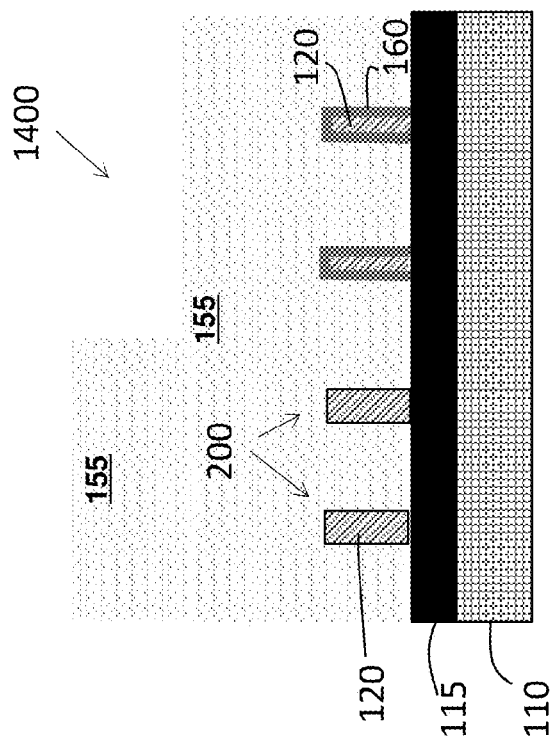
Figure 13:
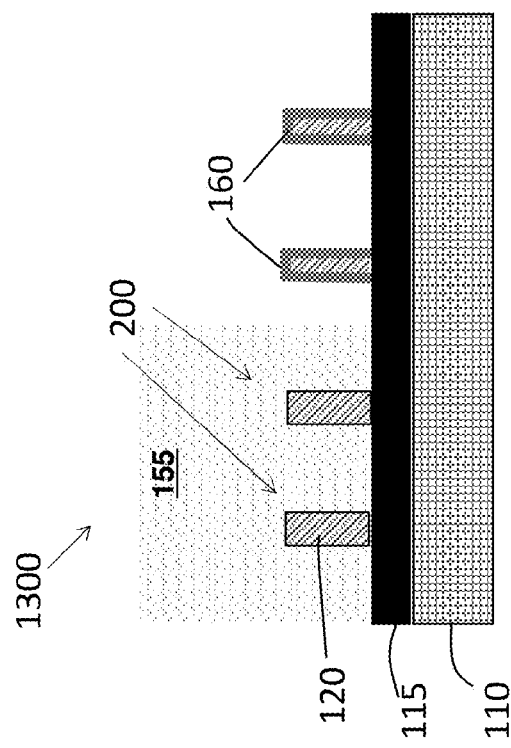
Figure 16:
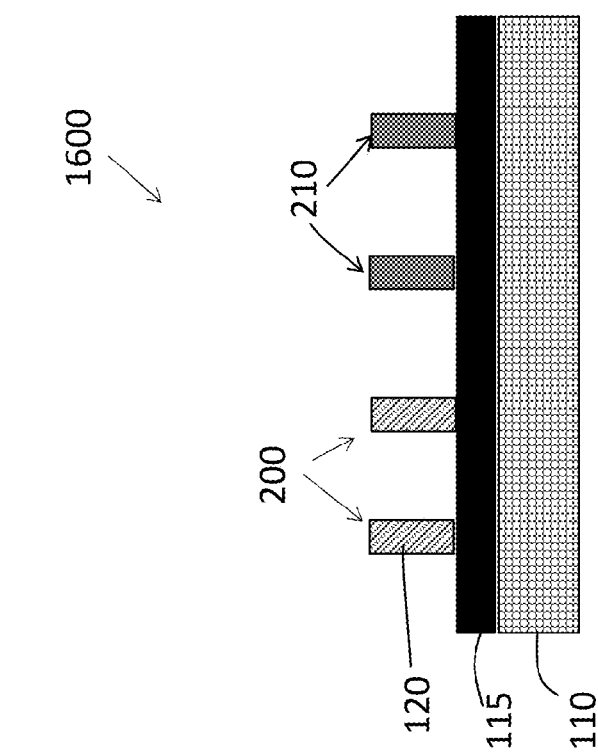

In FIG. 13, a SiGe layer 160 is epitaxially grown on the exposed thinned Si fins 200 in the pFET region 102, resulting in the intermediate structure 1300. FIG. 14 illustrates the intermediate structure 1400 after additional oxide mask 155 is deposited to cover the fins 210 in the pFET region 102. This is followed by a thermal anneal is to drive Ge (from the SiGe layer 160) into the Si core of the SOI layer 120 forming the Si fins 200 in the pFET region 102. The thermal anneal may be performed at a temperature between about 850° C. and 1100° C. in an oxygen-containing environment (such as an oven), in which oxygen-containing gases, such as oxygen, are introduced, for example. The anneal results in the formation of a silicon oxide layer from the outer SiGe layer 160 due to the presence of oxygen. Germanium atoms in the SiGe layer 160 migrate inwardly to form SiGe fins 210. This results in the intermediate structure 1500, which includes SiGe fins 210 in the pFET region 102. The outer shell of the Si fin 200 in the nFET region 101 also becomes oxidized. This oxidation leaves a slimmer Si fin 200 core. In FIG. 16, a dHF wet etch process is used to remove the oxide from the outer shell of the fins 200, 210, resulting in the fin structure 1600 having Si fins 200 and SiGe fins 210. As FIG. 16 indicates, the Si fins 200 and SiGe fins 210 have the same dimensions. The dimensions are accomplished by adjusting the thickness of SiGe layer 160 and the process conditions of the thermal annealing discussed with reference to FIG. 15.

FIGS. 17-22 detail the processes involved in integrated fin formation according to another embodiment of the invention. FIG. 17 is a cross-sectional view of an intermediate structure 1700 in the fin formation according to the other embodiment. FIG. 17 is identical to FIG. 6 and is used as a starting point to show the differences between the embodiment discussed with reference to FIGS. 1-16 and the embodiment discussed with reference to FIGS. 17-22. In lieu of thinning the sidewall spacers 145 in the pFET region 102 prior to transfer into the SOI layer 120, in this embodiment, the Si fins 200 in both the nFET region 101 and the PFET region 102 are initially formed at the same width, after which the Si fins 200 in the pFET region 102 are subsequently thinned.

Figure 19:
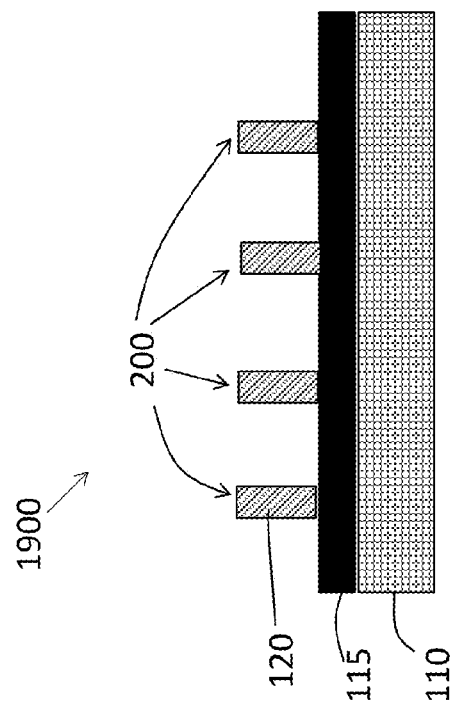

More specifically, FIG. 18 is a cross-sectional view of an intermediate structure 1800 in the fin formation according to an alternative embodiment. An RIE process is performed to transfer the pattern of the sidewall spacers 145 to form Si fins 200. Again, FIG. 18 is similar to FIG. 10 but all the resulting Si fins 200 (in both the nFET region 101 and the pFET region 102) are initially the same width (in the cross-sectional view). In FIG. 10, on the other hand, the Si fins 200 in the pFET region 102 are already narrower upon pattern transfer into the SOI layer 120. FIG. 19 illustrates the intermediate structure 1900 after removal of the spacer material 145, the hard mask layer 130, and the dielectric layer 125 from the intermediate structure 1800 of FIG. 18, leaving the Si fins 200.

Figure 15:
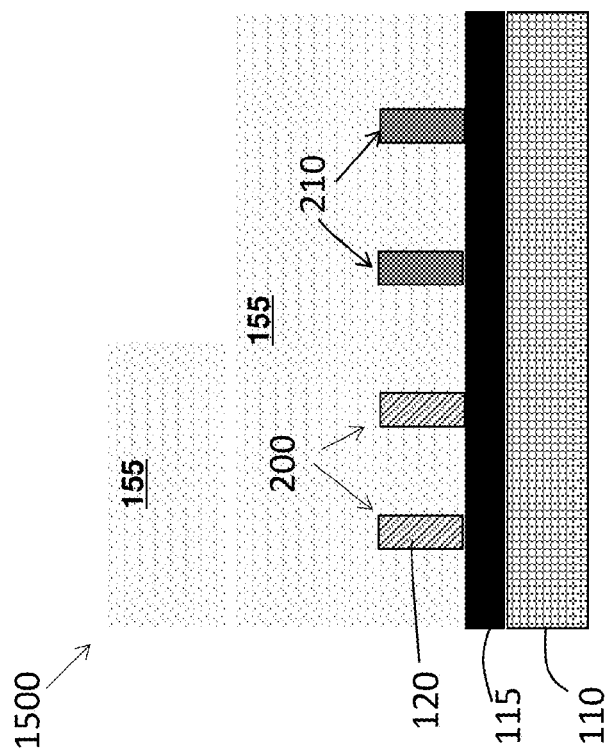
Figure 20:
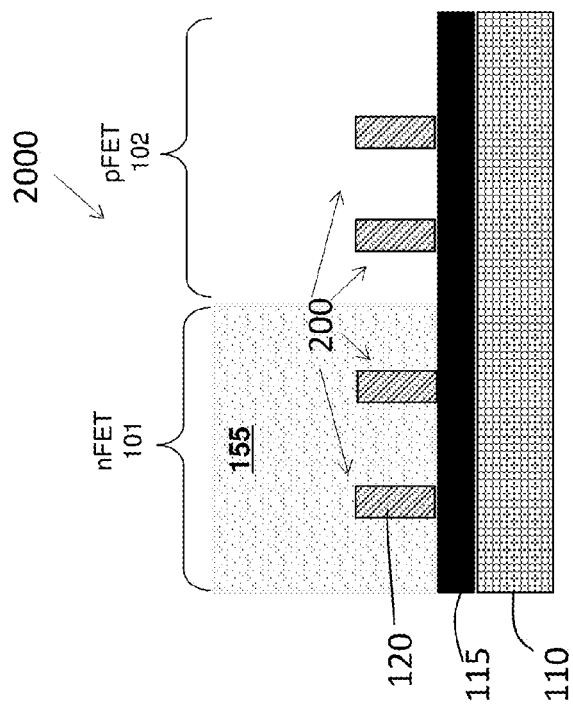
Figure 22:
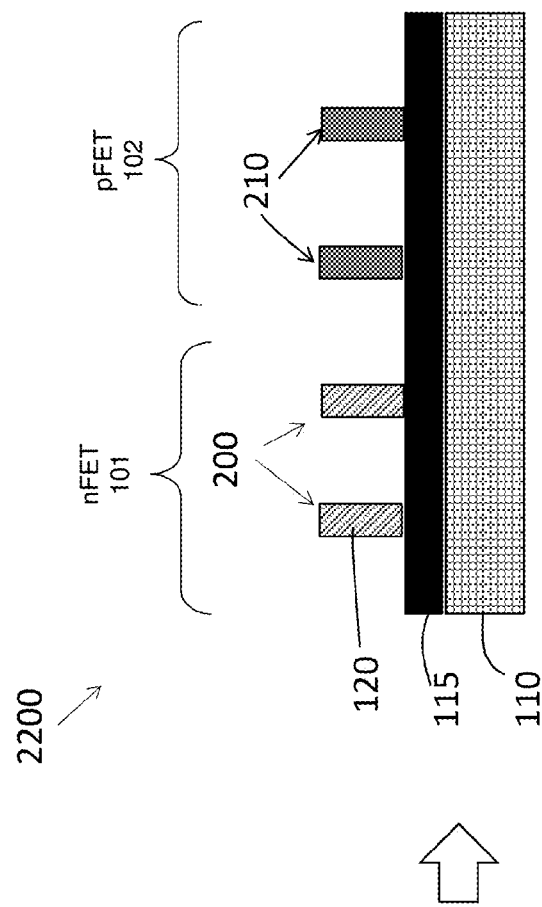
Figure 21:
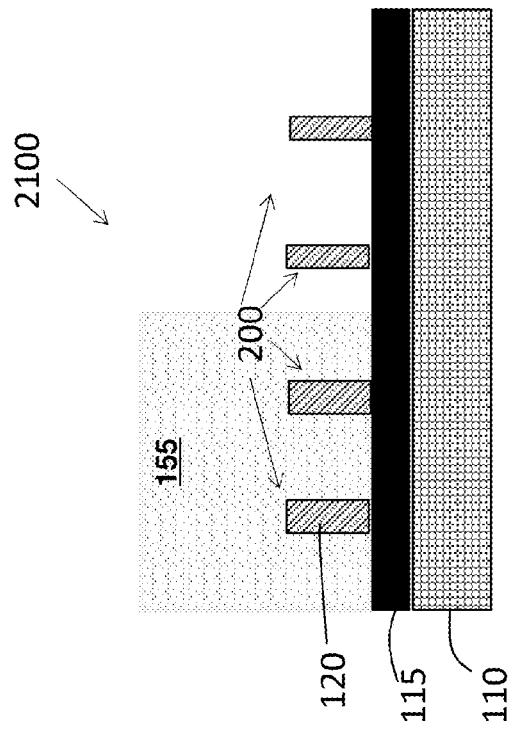

In FIG. 20, an oxide mask 155 is deposited over the intermediate structure 1900 shown in FIG. 19 and patterned to cover the Si fins 200 in the nFET region 101. At this stage, the Si fins 200 in both the nFET region 101 and the pFET region 102 are still the same width as FIG. 20 shows. Then, as shown in FIG. 21 the Si fins 200 in the pFET region 102 are trimmed to result in the intermediate structure 2100. The trimming is accomplished, for example, by using an isotropic etch or wet etch process. At this stage, the intermediate structure 2100 is identical to the intermediate structure 1200 shown in FIG. 12. Thus, processes described with reference to FIGS. 13-15 are performed on the structure 2100 shown in FIG. 21 to obtain the Si fins 200 and SiGe fins 210 shown in FIG. 22. Specifically, starting with the structure 2100 shown in FIG. 21, an SiGe layer 160 is epitaxially grown on the Si fin 200 in the pFET region 102. A controlled thermal anneal is then performed as described above with reference to FIG. 15 followed by a dHF wet etch process to remove the oxide (resulting from the anneal) on the outer shell of the fins 200, 210. FIG. 22 is a cross-sectional view of a structure 2200 that includes the Si fins 200 and SiGe fins 210 according to the other embodiment of the invention. The structure 2200 represents relevant aspects of a CMOS device with fins 200, 210 in the nFET region 101 and the pFET region 102.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated The flow diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

While the preferred embodiment to the invention had been described, it will be understood that those skilled in the art, both now and in the future, may make various improvements and enhancements which fall within the scope of the claims which follow. These claims should be construed to maintain the proper protection for the invention first described.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of fabricating silicon (Si) and silicon germanium (SiGe) fins, the method comprising:
   forming at least two Si fins on a buried oxide (BOX) layer disposed on a substrate, at least one of the at least two Si fins being formed in a first region and at least one of the at least two Si fins being formed in a second region, the at least one of the at least two Si fins in the second region being thinner than the at least one of the at least two Si fins in the first region;
   depositing an oxide mask over the first region;
   epitaxially growing an SiGe layer on the at least one of the at least two Si fins in the second region; and
   performing a thermal annealing process to drive Ge from the SiGe layer into the at least one of the at least two Si fins in the second region to form at least one SiGe fin in the second region.

2. The method according to claim 1, wherein the depositing the oxide mask over the first region includes depositing the oxide mask and patterning to cover the first region.

3. The method according to claim 1, wherein the performing the thermal annealing process is controlled such that the at least one of the at least two Si fins in the first region and the at least one SiGe fin in the second region have a same cross sectional width.

4. The method according to claim 1, further comprising depositing the oxide mask additionally over the first region and over the second region prior to performing the thermal annealing process.

5. The method according to claim 1, further comprising removing oxide from outer shells of the at least one of the at least two Si fins in the first region and the at least one SiGe fin in the second region using a wet etch process with diluted hafnium fluoride (dHF).

6. The method according to claim 1, further comprising trimming the at least one of the at least two Si fins in the second region.

7. The method according to claim 6, wherein the trimming the at least one of the at least two Si fins in the second region is achieved by an isotropic etch process or a wet etch process.

8. The method according to claim 1, further comprising trimming a spacer material used to obtain the at least one of the at least two Si fins in the second region.

9. The method according to claim 8, wherein the trimming the spacer material is achieved by a chemical oxide removal (COR) process when the spacer material is an oxide.

10. The method according to claim 8, wherein the trimming the spacer material is achieved based on oxidizing the spacer material and using a dilute hafnium fluoride (dHF) to remove a resulting oxide when the spacer material is a nitride.

11. A complementary metal-oxide semiconductor (CMOS) device, comprising:
   a substrate;
   a buried oxide (BOX) layer deposited on the substrate; and
   silicon (Si) and silicon germanium (SiGe) fins fabricated according to the method of claim 1.

12. A method of fabricating a complementary metal-oxide semiconductor (CMOS) device, the method comprising:
   forming an n-channel field effect transistor (nFET) region;
   forming a p-channel field effect transistor (pFET) region;
   forming at least one silicon (Si) fin in the nFET region on a buried oxide (BOX) layer on a substrate;
   forming at least one Si fin in the pFET region on the BOX layer, the at least one Si fin in the PFET region being thinner than the at least one Si fin in the nFET region;
   depositing an oxide mask over the nFET region;
   epitaxially growing a silicon germanium (SiGe) layer on the at least one Si fin in the pFET region; and
   performing a thermal annealing process to drive Ge form the SiGe layer into the at least one Si fin in the pFET region to form at least one SiGe fin in the pFET region.

13. The method according to claim 12, wherein the performing the thermal annealing process is controlled such that the at least one Si fin in the nFET region and the at least one SiGe fin in the pFET region have a same cross sectional width.

14. The method according to claim 12, further comprising depositing the oxide mask additionally over the nFET region and over the pFET region prior to performing the thermal annealing process.

15. The method according to claim 12, further comprising removing oxide from outer shells of the at least one Si fin in the nFET region and the at least one SiGe fin in the pFET region using a wet etch process with diluted hafnium fluoride (dHF).

16. The method according to claim 12, further comprising trimming the at least one Si fin in the pFET region.

17. The method according to claim 16, wherein the trimming the at least one Si fin in the pFET region is achieved by an isotropic etch process or a wet etch process.

18. The method according to claim 12, further comprising trimming a spacer material used to obtain the at least one Si fin in the pFET region.

19. The method according to claim 18, wherein the trimming the spacer material is achieved by a chemical oxide removal (COR) process when the spacer material is an oxide.

20. The method according to claim 18, wherein the trimming the spacer material is achieved based on oxidizing the spacer material and using a dilute hafnium fluoride (dHF) to remove a resulting oxide when the spacer material is a nitride.

* * * * *